(12) United States Patent
Kubota et al.

(10) Patent No.: US 7,839,081 B2
(45) Date of Patent: Nov. 23, 2010

(54) EMISSIVE DEVICE AND ELECTRONIC APPARATUS HAVING LIGHT TRANSMITTING PORTIONS OF LIGHT SHIELDING LAYER BEING SMALLER THAN PARTITION OPENING

(75) Inventors: Takehiko Kubota, Suwa (JP); Eiji Kanda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 299 days.

(21) Appl. No.: 11/612,858

(22) Filed: Dec. 19, 2006

(65) Prior Publication Data

US 2007/0159043 A1    Jul. 12, 2007

(30) Foreign Application Priority Data

Jan. 11, 2006    (JP)    ............... 2006-003304

(51) Int. Cl.
    H01J 1/62    (2006.01)
(52) U.S. Cl. ............... 313/506; 313/501; 313/507; 313/509
(58) Field of Classification Search .......... 313/498–512
    See application file for complete search history.

(56) References Cited

U.S. PATENT DOCUMENTS

| 6,737,800 | B1 * | 5/2004 | Winters et al. ............... 313/504 |
| 6,801,000 | B2 | 10/2004 | Jongman et al. |
| 7,154,219 | B2 | 12/2006 | Hamada et al. |
| 7,365,487 | B2 | 4/2008 | Matsuura et al. |
| 7,417,373 | B2 | 8/2008 | Yamazaki |
| 7,459,847 | B2 | 12/2008 | Kurosawa et al. |
| 7,550,914 | B2 | 6/2009 | Eida et al. |
| 2004/0164668 | A1 | 8/2004 | Kanno et al. |
| 2005/0067945 | A1 * | 3/2005 | Nishikawa et al. .......... 313/501 |
| 2005/0077816 | A1 * | 4/2005 | Yamada et al. .............. 313/503 |
| 2007/0085471 | A1 * | 4/2007 | Cok .......................... 313/503 |

FOREIGN PATENT DOCUMENTS

| JP | A-63-198002 | 8/1988 |
| JP | A 8-321380 | 12/1996 |
| JP | A-2003-257665 | 9/2003 |
| JP | A 2003-288983 | 10/2003 |
| JP | A-2003-536226 | 12/2003 |
| JP | A-2005-222915 | 8/2005 |
| JP | 2005-268062 A | 9/2005 |
| JP | A-2005-235566 | 9/2005 |
| JP | A-2005-285395 | 10/2005 |
| JP | A-2005-285977 | 10/2005 |
| JP | 2005-322633 A | 11/2005 |
| WO | WO 2005/098802 A1 | 10/2005 |

* cited by examiner

Primary Examiner—Bumsuk Won
(74) Attorney, Agent, or Firm—Oliff & Berridge, PLC

(57) ABSTRACT

An emissive device includes a substrate; a plurality of light-emitting elements disposed on the substrate; a light-shielding layer opposite the substrate, the light-emitting elements being disposed between the substrate and the light-shielding layer, and the light-shielding layer having light-transmitting portions that transmit light emitted from the light-emitting elements; and a partition composed of an insulating material and disposed on the substrate, the partition partitioning the light-emitting elements and having openings each demarcating the light-emitting region of the corresponding light-emitting element, wherein each of the light-transmitting portions overlaps the corresponding opening and is smaller than the corresponding opening.

13 Claims, 5 Drawing Sheets

EMISSIVE DEVICE AND ELECTRONIC APPARATUS HAVING LIGHT TRANSMITTING PORTIONS OF LIGHT SHIELDING LAYER BEING SMALLER THAN PARTITION OPENING

The entire disclosure of Japanese Application No. 2006-003304, filed Jan. 11, 2006 is expressly incorporated by reference herein.

BACKGROUND

1. Technical Field

The present invention relates to an emissive device including light-emitting elements, such as organic light-emitting diodes, which emit light having a luminance level corresponding to a current, and relates to an electronic apparatus including the emissive device.

2. Related Art

Electroluminescent (EL) elements that are excited by an electric field to emit light are one known example of light-emitting elements. In an emissive device including EL elements, many pixel circuits are arrayed in a matrix on a substrate, and one of the EL elements is disposed in each pixel circuit. Each EL element has a light-emitting layer disposed between an anode and a cathode. A hole injection layer or other layer is disposed between the anode and the cathode, in some cases.

An example of such an emissive device is of the top emission type, in which light emitted from an EL element emerges from a side opposite a substrate, as described in Japanese Unexamined Patent Application Publication No. 2003-288983 (Patent Document 1) and the like. Furthermore, Patent Document 1 also discloses a light-shielding layer as black matrix opposite the substrate. The light-shielding layer has light-transmitting portions. Light emitted from each EL element emerges through the corresponding light-transmitting portion. Each light-transmitting portion has a color filter. Moreover, Patent Document 1 discloses a partition composed of an insulating material and disposed on the substrate to partition the light-emitting elements. Openings in the partition demarcate light-emitting regions of the light-emitting elements. That is, pixel electrodes are in contact with the light-emitting layers or hole injection layers in the openings in the partition. When a current flows between the pixel electrodes and opposite electrodes, the light-emitting layers disposed in the opening emit light.

Each light-transmitting portion of the light-shielding layer disclosed in Patent Document 1 is wider than the corresponding opening in the partition. It seems that this structure is employed so as to maximize the radiation of pencils of light emitted from the light-emitting regions, which correspond to the openings in the partition, of the light-emitting elements to the outside. In this structure, the pencils of light viewable from the outside are regulated by the openings in the partition.

The light-emitting layers and the hole injection layers of the emissive device have high adhesion to the pixel electrodes but low adhesion to the partition. Thus, each of the light-emitting layers or each of the hole injection layers may have nonuniform thickness in the corresponding opening in the partition. Furthermore, in some cases, each light-emitting layer or each hole injection layer does not adhere to the corresponding pixel electrode in the vicinity of the partition. In these cases, luminance and chromaticity disadvantageously vary in a single pixel. Specifically, luminance and chromaticity at the peripheral portion close to the partition in each pixel may differ from those at the middle portion remote from the partition in the same pixel. In the art described in Patent Document 1, since the light-transmitting portion of each light-shielding layer is wider than the corresponding opening in the partition, non-uniformity in luminance and chromaticity in a single pixel may be visually identified.

Furthermore, in the art described in Patent Document 1, since the light-transmitting portion of each light-shielding layer is wider than the corresponding opening in the partition, pencils of light coming through the light-transmitting portion of each light-shielding layer and then radiating to the outside diverge at a large solid angle. When the emissive device is used as an image display, the divergence of the pencils of light may affect viewability. When the emissive device is used as an exposure device that is required to have high accuracy, the excess divergence of the pencils of light adversely affects accuracy.

SUMMARY

An advantage of some aspects of the invention is that an emissive device has uniform quality in each pixel and enhanced directivity of pencils of light radiating to the outside. Another advantage of some aspects of the invention is that an electronic apparatus includes the emissive device.

An emissive device according to an aspect of the invention includes a substrate; a plurality of light-emitting elements disposed on the substrate; a light-shielding layer opposite the substrate, the light-emitting elements being disposed between the substrate and the light-shielding layer, and the light-shielding Layer having light-transmitting portions that transmit light emitted from the light-emitting elements; and a partition composed of an insulating material and disposed on the substrate, the partition partitioning the light-emitting elements and having openings each demarcating the light-emitting region of the corresponding light-emitting element, wherein each of the light-transmitting portions overlaps the corresponding opening and is smaller than the corresponding opening.

According to an aspect of the invention, the light-transmitting portions of the light-shielding layer overlap the respective openings in the partition partitioning the light-emitting elements and each are smaller than the corresponding opening. Thus, pencils of light viewable from the outside are regulated by the light-transmitting portions of the light-shielding layer. The light-shielding layer masks peripheries of pixels. Even when luminance and chromaticity at the peripheries of the pixels close to the partition differ from those at middle portions of the pixels remote from the partition, nonuniformity in luminance and chromaticity in a single pixel is not visually identified because the peripheries of the pixels are masked with the light-shielding layer. Furthermore, the light-transmitting portions of the light-shielding layer overlap the respective opening in the partition partitioning the light-emitting elements and are each smaller than the corresponding opening. Thus, it is possible to enhance the directivity of the pencils of light radiating to the outside.

According to an aspect of the invention, the emissive device having the light-transmitting portions of the light-shielding layer opposite the substrate includes reflective layers for reflecting light emitted from the light-emitting elements toward the light-transmitting portions. The reflective layers may be electrodes for the light-emitting elements. Alternatively, the reflective layers may be present separately from the electrodes. The reflective layers overlap the respective openings in the partition to reflect light emitted from the light-emitting elements. When each reflective layer is partially covered with the partition, the light-shielding layer preferably overlaps portions of the reflective layers that are covered by partition. The partition is often composed of a transparent material. Thus, light reflected from the partition-covered portions of the reflective layers may come through the partition to propagate toward the light-transmitting portions of the light-shielding layer. In particular, extraneous light enters the emissive device through the light-transmitting portions of the light-shielding layer in a well-lighted area. When light reflected from the reflective layers radiates to the outside through the light-transmitting portions, image contrast decreases. However, since the light-shielding layer overlaps the portions of the reflective layers that are covered by partition, it is possible to inhibit the radiation of the reflected light through the light-transmitting portions.

Preferably, the above-described emissive device further includes first electrodes; a second electrode; and a light-emitting sublayer disposed between the second electrode and the individual first electrodes, wherein each of the first electrodes is closer to the corresponding reflective layer than the second electrode, is composed of indium tin oxide (ITO), indium zinc oxide (IZO), or $ZnO_2$, overlaps the corresponding reflective layer, and is wider than the corresponding reflective layer. A conductive oxide material, such as ITO, IZO, or $ZnO_2$, having light transparency and conductivity can be used as electrodes for the light-emitting elements. Thus, the conductive oxide material can transmit light from the light-emitting elements to the reflective layers and can transmit light reflected from the reflective layers in the opposite direction. The first electrodes each composed of the conductive oxide material are patterned by etching with a strong acid, such as hydrogen bromide or hydrogen iodide. The reflective layers are each composed of a metal, such as aluminum, or other material having high reflectivity. Since each of the first electrodes overlaps the corresponding reflective layer and is wider than the corresponding reflective layer, it is possible to prevent the failure of the reflective layers caused by the use of a strong acid.

Preferably, color conversion layers for converting the color of light emitted from the light-emitting elements into different target colors are disposed at the respective light-transmitting portions, wherein the color conversion layers providing different target colors have different areas. Each of the color conversion layers may be a color filter that transmits more light of a predetermined wavelength range than light of other wavelength ranges. Alternatively, each of the color conversion layers may be composed of a photoluminescent material that receives light to emit another color of light. Luminous energy of the light-emitting elements is not uniform with respect to wavelengths of all colors. Degrees of conversion efficiency of the color conversion layers are different in response to the target colors. The term "conversion efficiency" means the ratio of the luminance of light incident on the color conversion layer to the luminance of outgoing light from the color conversion layer. Thus, even when a constant driving current is applied to light-emitting elements which have the same size and the same structure, the degrees of luminance of light converted through the color conversion layers are different in response to the types of color conversion layers, i.e., target colors. In consideration of spectrum properties of light incident on the color conversion layers and the conversion efficiency of the color conversion layers, luminous intensity (unit: candela), which is the product of luminance and an area, of each light-emitting element can be suitably set by changing the area of the corresponding color conversion layer in response to the target colors. Thereby, it is possible to improve image quality by striking a balance among the target colors.

An electronic apparatus according to an aspect of the invention includes the above-described emissive device. Examples of the electronic apparatus include personal computers, cellular phones, and personal digital assistants, which have the emissive devices as displays. Alternatively, the emissive device may be used as a printer head in an image printer using an electrophotographic method, the printer head forming a latent image by irradiating an image carrier with light.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described below with reference to the accompanying drawings. The drawings are not to scale.

Emissive Device

Figure 1:
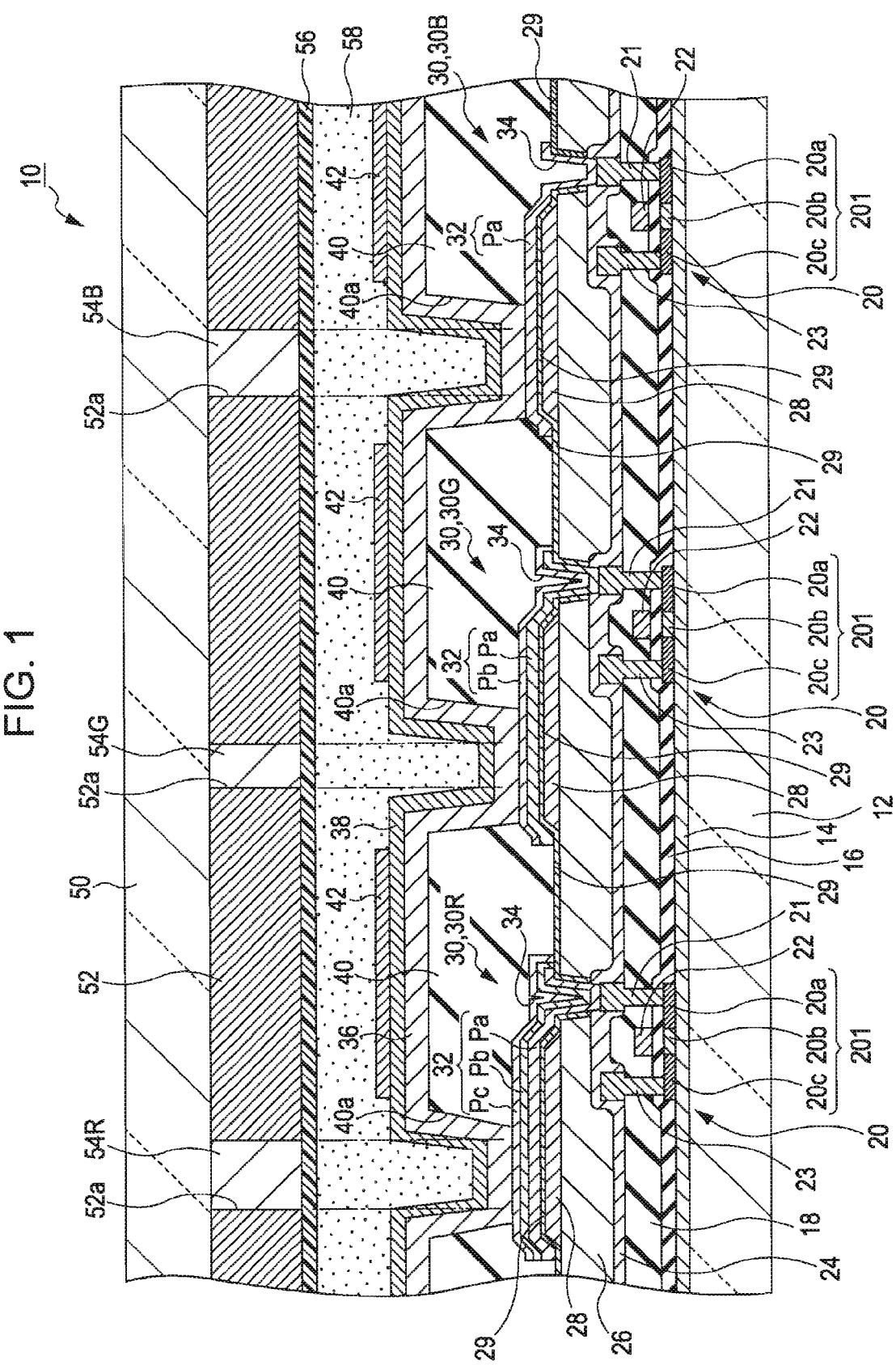
FIG. 1 is a fragmentary cross-sectional view of an emissive device according to an embodiment of the invention.

FIG. 1 is a fragmentary cross-sectional view of an emissive device 10 according to an embodiment of the invention. As shown in FIG. 1, the emissive device 10 includes a substrate 12 composed of, for example, glass or plastic. A substrate-protecting layer 14 mainly composed of silicon oxide is disposed on the substrate 12. A plurality of p-channel pixel transistors 20 are disposed on the substrate-protecting layer 14. The pixel transistors 20 are thin-film transistors (TFTs) and are arrayed in a matrix. The pixel transistors 20 are connected to respective light-emitting elements 30, which are described below, disposed on the substrate 12 to drive the light-emitting elements 30. That is, an active-matrix driving system is used in this emissive device 10. The emissive device 10 includes many light-emitting elements 30 and many pixel transistors 20. However, only three light-emitting elements 30 and three pixel transistors 20 are shown in FIG. 1.

The pixel transistors 20 will be described in detail. Silicon layers 201 are disposed on the substrate-protecting layer 14. The silicon layers 201 each have a drain region 20a, a channel region 20b, and a source region 20c. A gate-insulating layer 16 is disposed on the substrate-protecting layer 14 so as to cover the silicon layers 201. The gate-insulating layer 1.6 is composed of, for example, silicon oxide. Gate electrodes 22 are each disposed on a portion of the top face of the gate-insulating layer 16, the portion overlapping the silicon layers 201.

first insulating interlayer 18 is disposed on the gate-insulating layer 16 so as to the gate electrodes 22. The first insulating interlayer 18 is composed of silicon oxide or the like. Each of the silicon layers 201 is connected to a drain electrode 21 and a source electrode 23 via a contact hole passing through the gate-insulating layer 16 and the first insulating interlayer 18. One of the silicon layers 201, the corresponding gate electrode 22, the corresponding source electrode 23, and the corresponding drain electrode 21 are combined to constitute one of the pixel transistors 20.

A circuit-protecting film 24 is disposed on the first insulating interlayer 18 so as to cover the source electrodes 23 and the drain electrodes 21. The circuit-protecting film 24 is composed of a material, such as silicon nitride or silicon oxynitride, having low gas permeability. The silicon nitride or the silicon oxynitride may be an amorphous material and may have hydrogen. The circuit-protecting film 24 can prevent the elimination of hydrogen from the pixel transistors 20. The circuit-protecting film 24 may be disposed under the source electrodes and the drain electrodes.

A circuit-bump-planarizing film 26 having a bottom face facing the circuit-protecting film 24 and a top face remote from the circuit-protecting film 24 is disposed on the circuit-protecting film 24. The top face of the circuit-bump-planarizing film 26 has smaller bumps than those of the bottom face. That is, the circuit-bump-planarizing film 26 is used in order to planarize the bumps due to the pixel transistors 20 and the like. The circuit-bump-planarizing film 26 is composed of, for example, an organic polymer, such as an acrylic polymer or a polyimide. Alternatively, the circuit-bump-planarizing film 26 composed of an inorganic material, such as silicon oxide or silicon oxynitride, may be formed by evaporation, and then the top face thereof may be planarized by etching or the like.

Figure 2:
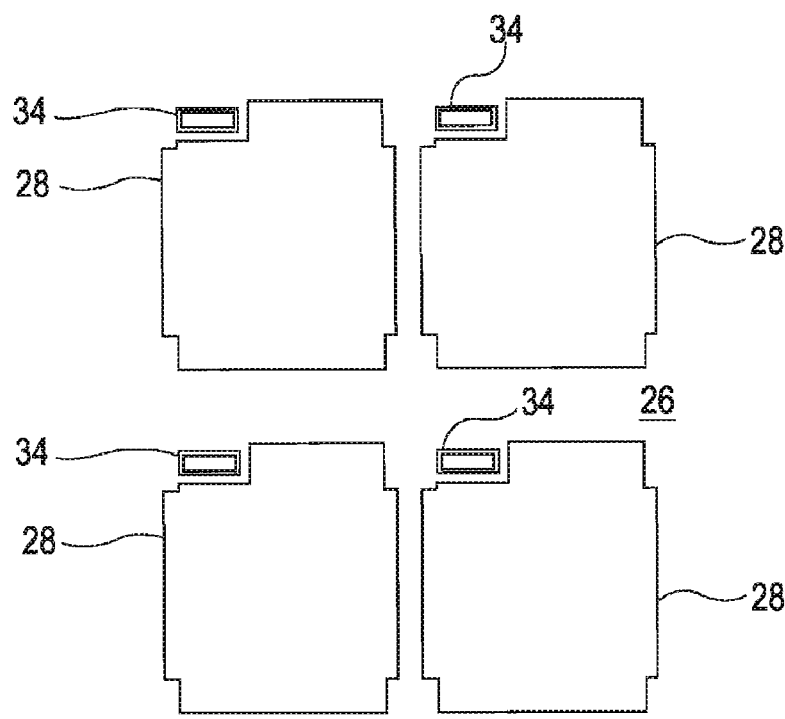
FIG. 2 is a plan view illustrating a state in the course of the production of the emissive device shown in FIG. 1.

Reflective layers 28 are disposed on the circuit-bump-planarizing film 26. The reflective layers 28 are each composed of a metal, such as aluminum, or other material having high reflectivity. The reflective layers 28 are locally disposed under the light-emitting elements 30 in order to reflect light emitted from the light-emitting elements 30 toward the upper side of the figure. Each of the reflective layers 28 partially covers the corresponding pixel transistor 20. Specifically, each of the reflective layers 28 is disposed so as to cover the corresponding source electrode 23, the corresponding gate electrode 22, and the corresponding channel region 20b. FIG. 2 is a plan view illustrating a state in which the reflective layers 28 are disposed on the circuit-bump-planarizing film 26. The circuit-bump-planarizing film 26 includes contact holes 34 described below.

As shown in FIG. 1, dielectric layers 29 each composed of, for example, silicon oxide or silicon nitride are disposed on the circuit-bump-planarizing film 26 so as to cover the reflective layers 28. The dielectric layers 29 are disposed to insulate the light-emitting elements 30 from the reflective layers 28 and to appropriately adjust the distance between each light-emitting element 30 and the corresponding reflective layer 28.

Figure 3:
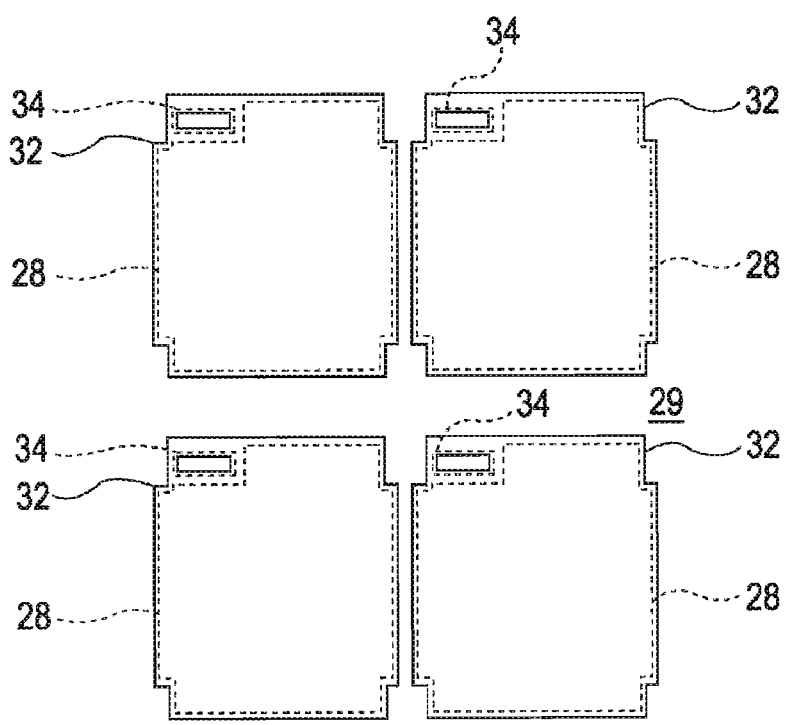
FIG. 3 is a plan view illustrating a state after the state shown in FIG. 2 in the course of the production of the emissive device.

The light-emitting elements 30 (30R, 30G, and 30B) are disposed on the respective dielectric layers 29 and cover the respective reflective layers 28. Specifically, pixel electrodes (first electrodes) 32 of the light-emitting elements 30 are disposed on the respective dielectric layers 29. The pixel electrodes 32 function as anodes for the pixel electrodes 32. Each pixel electrode 32 is connected to the corresponding drain electrode 21 via the corresponding contact hole 34 passing through the circuit-bump-planarizing film 26 and the circuit-protecting film 24. Each of the pixel electrodes 32 functioning as the anodes is preferably composed of a material having a large work function, e.g., ITO, IZO, or $ZnO_2$. Each pixel electrode 32 overlaps the corresponding reflective layer 28 and is wider than the corresponding reflective layer 28. A conductive oxide material, such as ITO, IZO, or $ZnO_2$, having light transparency and conductivity can transmit light from the light-emitting elements 30 to the reflective layers 28 and can transmit light from the reflective layers 28 in the opposite direction. The pixel electrodes 32 each composed of the conductive oxide material are patterned by etching with a strong acid, such as hydrogen bromide or hydrogen iodide. The reflective layers 28 are each composed of a metal, such as aluminum, or other material having high reflectivity. Since each of the pixel electrodes 32 overlaps the corresponding reflective layer 28 and is wider than the corresponding reflective layer 28, it is possible to prevent the failure of the reflective layers 28 due to the strong acid. FIG. 3 is a plan view illustrating a state in which the pixel electrodes 32 are disposed on the respective dielectric layers 29.

As shown in FIG. 1, each of the light-emitting elements 30 is an organic light-emitting diode (OLED), i.e., organic electroluminescent element. Each light-emitting element 30 includes the corresponding pixel electrode 32, a common electrode 38 (second electrode), and a light-emitting-functional layer 36 disposed between the corresponding pixel electrode 32 and the common electrode 38. In this embodiment, each of the light-emitting elements 30 includes the anode as the independent pixel electrode. The common electrode 38 extends across all of the light-emitting elements 30 and functions as a cathode.

The light-emitting-functional layer 36 includes at least a light-emitting sublayer. The material constituting the light-emitting sub aver is an organic electroluminescent material having a low molecular weight and emits light by applying an electric field. The light-emitting-functional layer 36 may include a hole injection sublayer, a hole transport sublayer, an electron transport sublayer, an electron injection sublayer, a hole-blocking sublayer, and an electron-blocking sublayer in addition to the light-emitting sublayer. All of the sublayers or some of the sublayers may be included in the light-emitting-functional layer 36. The light-emitting sublayer of the light-emitting-functional layer 36 emits white light, which contains the wavelength of red light, the wavelength of green light, and the wavelength of blue light, when a current flows from the pixel electrodes 32 to the common electrode 38 with the pixel transistors 20.

The common electrode 38 is transparent. Light emitted from the light-emitting elements 30 comes through the common electrode 38 and radiates toward the upper side of the figure. That is, the emissive device 10 according to this embodiment is of the top emission type, in which light emerges from the opposite side of the substrate 12. To allow the common electrode 38 to function as a cathode for all of the light-emitting elements 30, the common electrode 38 is composed of a material having a low work function, thus facilitating injection of electrons. Examples of the material having a low work function include aluminum, calcium, magnesium, lithium, and alloys thereof. Furthermore, each of the alloys is preferably composed of a material having a low work function and another material for stabilizing the material having a low work function. For example, an alloy of magnesium and silver is preferred. When one of the metals or alloys is used for the common electrode 38, the common electrode 38 may have a smaller thickness to obtain light transparency.

Alternatively, the common electrode 38 may include a first layer composed of the material having a low work function or the material having a low work function and the material for stabilizing the material having a low work function; a second layer composed of a conductive oxide material, such as ITO, IZO, or $ZnO_2$, with light transparency and conductivity, wherein the first layer may be disposed adjacent to the light-emitting-functional layer.

As described above, the light-emitting sublayers in all or the light-emitting elements 30 (30R, 30G, and 30B) emit white light. Each of the light-emitting elements 30 has a structure such that the intensity of light of a predetermined wavelength is higher than that of light of other wavelengths. Among the light-emitting elements 30, light-emitting elements 30R are light-emitting elements for providing output light of red. Light-emitting elements 30G are light-emitting elements for providing output light of green. Light-emitting elements 30B are light-emitting elements for providing output light of blue. The pixel electrode 32 of each light-emitting element 30B includes a single pixel electrode layer Pa. The pixel electrode 32 of each light-emitting element 30G includes two pixel electrode layers Pa and Pb. The pixel electrode 32 of each light-emitting element 30R includes three pixel electrode layers Pa, Pb, and Pc. The pixel electrode layers Pa are disposed in all of the light-emitting elements 30 and each have a uniform thickness. The pixel electrode layers Pb are disposed in the light-emitting elements 30G and 30R and each have a uniform thickness. The pixel electrode layers Pc are disposed in the light-emitting elements 30R alone and each have a uniform thickness. The pixel electrode layers Pa, Pb, and Pc are each composed of the same material, i.e., the pixel electrode layers Pa, Pb, and Pc are each composed of ITO, TZO, or $ZnO_2$.

The combination of each of the pixel electrodes 32, the corresponding dielectric layer 29, and the corresponding reflective layer 28 function as an optical resonator that increases the intensity of light of a predetermined wavelength emitted from the light-emitting elements 30 compared with light of other wavelengths. The optical resonator has at least one of the effect of increasing the intensity of light of a predetermined wavelength compared with the intensity of light at the time of emission from the corresponding light-emitting sublayer; and the effect of reducing the intensity of light of wavelengths other than a predetermined wavelength compared with the intensity of light at the time of emission from the corresponding light-emitting sublayer. For example, in each light-emitting element 30R, the combination of each pixel electrode 32, the corresponding dielectric layer 29, and the corresponding reflective layer 28 has at least one of the effect of increasing the intensity of a red light component compared with the intensity of light at the time of emission from the corresponding light-emitting sublayer; and the effect of reducing the intensity of light components other than the red light component compared with the intensity of light at the time of emission from the corresponding light-emitting sublayer.

The thickness of each pixel electrode layer Pa, i.e., the thickness of the pixel electrode 32 of each light-emitting element 30B, is appropriately determined in such a manner that the intensity of a blue light component in light emitted from the corresponding light-emitting element 30 is higher than other light components. The total thickness of the pixel electrode layers Pa and Pb, i.e., the thickness of the pixel electrode 32 of each light-emitting element 30G, is appropriately determined in such a manner that the intensity of a green light component in light emitted from the corresponding light-emitting element 30 is higher than other light components. The total thickness of the pixel electrode layers Pa, Pb, and Pc, i.e., the thickness of the pixel electrode 32 of each light-emitting element 30R, is appropriately determined in such a manner that the intensity of a red light component in light emitted from the corresponding light-emitting element 30 is higher than other light components. The thickness of each dielectric layer 29, i.e., the distance between each pixel electrode 32 and the corresponding reflective layer 28, is determined in such a manner that each optical resonator for blue, green, or red operates satisfactorily.

The light-emitting elements 30 are partitioned with a partition 40 composed of an insulating material. The partition 40 insulates the pixel electrodes 32 from the common electrode 38 and insulates pixel electrodes 32 from each other. The presence of the partition 40 results in independent control of each pixel electrode 32. That is, it is possible to allow a current to pass independently through each light-emitting element. The partition 40 is composed of a transparent resin, such as an acrylic resin or a polyimide resin.

Figure 4:
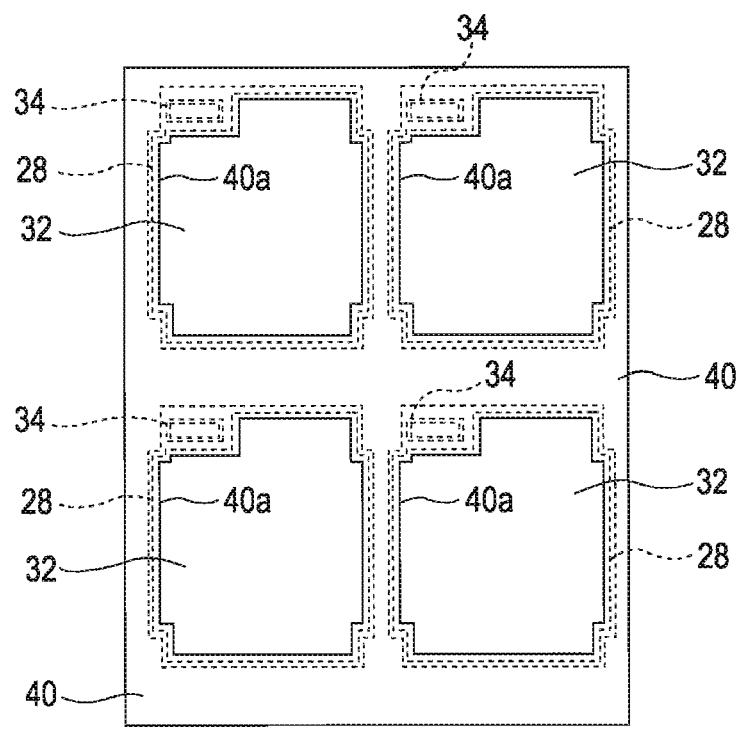
FIG. 4 is a plan view illustrating a state after the state shown in FIG. 3 in the course of the production of the emissive device.

The partition 40 is disposed on the dielectric layers 29. The partition 40 includes openings 40a for demarcating light-transmitting portions of the light-emitting elements 30. Each of the openings 40a in the partition 40 entirely overlaps the corresponding pixel electrode 32. That is, the pixel electrodes 32 are exposed through the openings 40a before the formation of the light-emitting-functional layer 36. Each opening 40a is smaller than the corresponding pixel electrode 32. Ends of each pixel electrode 32 are partially covered with the partition 40. FIG. 4 is a plan view illustrating a state in which the partition 40 is disposed on the dielectric layers 29.

Each reflective layer 28 overlaps the corresponding opening 40a in the partition 40 in order to reflect light from the light-emitting sublayer of the corresponding light-emitting elements 30. Each reflective layer 28 is partially covered with the partition 40. The region of each reflective layer 28 and the region of each pixel electrode 32 are wider than the corresponding opening 40a of the partition 40. Thus, pencils of light in which the intensity of a light component of a predetermined wavelength is increased with the optical resonator propagate toward the upper side of the figure through the openings 40a.

The light-emitting-functional layer 36 is disposed in at least the openings 40a. The light-emitting-functional layer 36 covers the partition 40, extends across all of the light-emitting elements 30, and functions as a common electrode for all of the light-emitting elements 30. As described above, the light-emitting-functional layer 36 emits white light. The light-emitting-functional layer 36 has a uniform thickness, regardless of the types of output light of the light-emitting elements 30. The light-emitting-functional layer 36 may be patterned in such a manner that each light-emitting element 30 includes independent light-emitting-functional layer, i.e., in such a manner that the light-emitting-functional layers are disposed in only the respective openings 40a (not shown). The light-emitting-functional layer may be patterned in such a manner that the light-emitting elements which emit the same output light are connected to a common light-emitting-functional layer (not shown).

The common electrode 38 covers the partition 40 and is disposed in the openings 40a. The common electrode 38 has a uniform thickness, regardless of the output light of the light-emitting elements 30.

Figure 5:
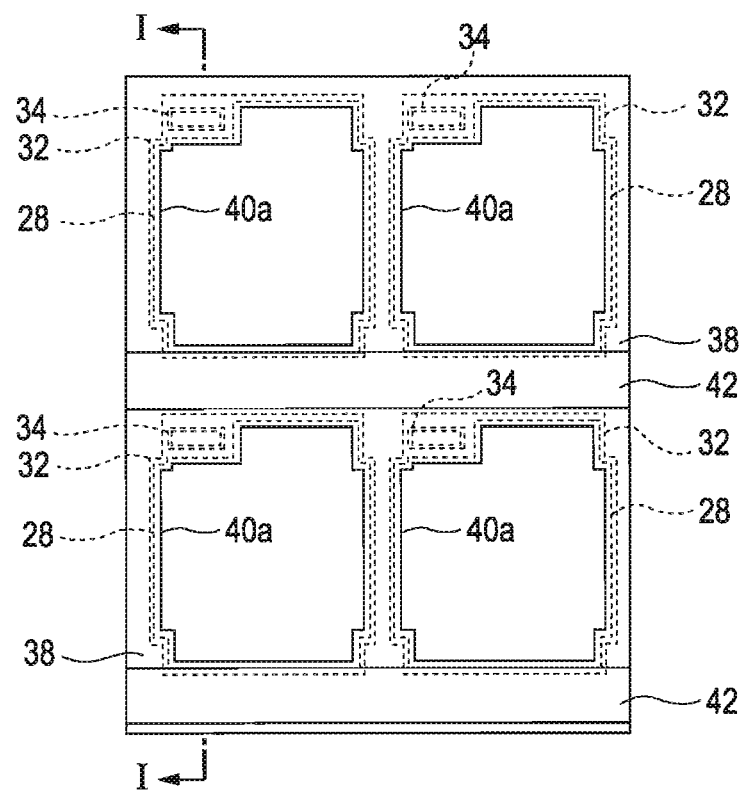
FIG. 5 is a plan view illustrating a state after the state shown in FIG. 4 in the course of the production of the emissive device.

Auxiliary leads 42 are disposed on the common electrode 38 and above the partition 40. The auxiliary leads 42 are in surface contact with the common electrode 38. FIG. 5 is a plan view illustrating a state in which the auxiliary leads 42 are disposed on the common electrode 38. FIG. 1 is a cross-sectional view taken along line I-I shown in FIG. 5. The term "auxiliary leads" defined here means conductive members disposed on the common electrode 38 and electrically connected to the common electrode 38 to reduce the resistance of the common electrode 38. For example, the auxiliary leads 42 may be composed of the same material as that of the common electrode 38. Alternatively, the auxiliary leads 42 may be composed of other conductive material. In the figure, the auxiliary leads 42 are disposed on the common electrode 38. However, the auxiliary leads 42 may be disposed under the common electrode 38.

The resulting substrate 12 including the light-emitting elements 30 is bonded to an opposite substrate 50 with an adhesive 58. The opposite substrate 50 is composed of, for example, glass or a transparent plastic material. The opposite substrate 50 includes a light-shielding layer 52 as a black matrix. The light-shielding layer 52 includes light-transmitting portions 52a. Light emitted from the light-emitting elements 30 radiates toward the upper side of the figure through the light-transmitting portions 52a. Each of the light-transmitting portions 52a includes color filters 54R, 54G, or 54B.

The color filters 54R, 54G, or 54B overlap the respective light-emitting elements 30. The color filters can convert the color of light emitted from the light-emitting elements 30 into target colors. Precisely, each of the color filters transmits more light of a predetermined wavelength range than light of other wavelength ranges. Specifically, the color filter 54R transmits more a red light component than other light components. The color filter 54G transmits more a green light component than other light components. The color filter 54B transmits more a blue light component than other light components. In order to prevent the mixture of colors of light among the color filters, the color filters 54R, 54G, and 54B are surrounded by the light-shielding layer 52 for shielding light, thus being shielded from each other. The light-shielding layer 52 is formed of an organic film containing a black pigment. Alternatively, the light-shielding layer 52 may be composed of a metal, such as titanium or chromium, or an oxide thereof.

A barrier layer 56 is bonded to the light-shielding layer 52 and the color filters 54R, 54G, and 54B. The barrier layer 56 is bonded to the common electrode 38 with the adhesive (filling agent) 58 composed of a transparent resin. The barrier layer 56 is composed of an inorganic material, such as silicon oxide, silicon nitride, or silicon oxynitride, having low liquid permeability The barrier layer 56 prevents the diffusion of coloring materials in the color filters into the adhesive 58.

Figure 6:
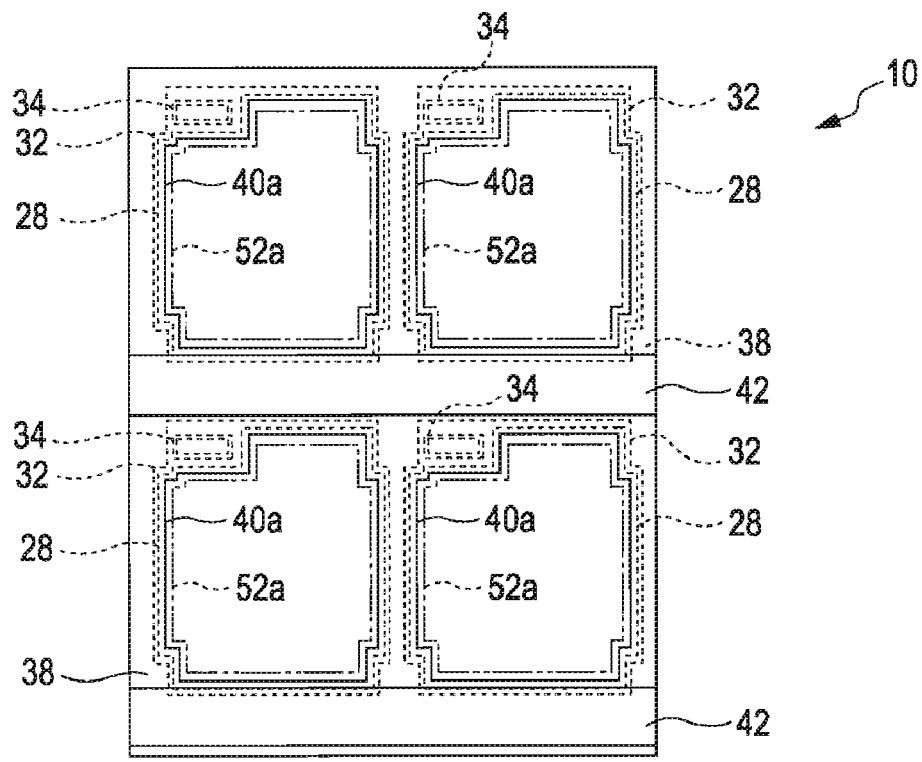
FIG. 6 is a plan view illustrating a state in which light-transmitting portions of a light-shielding layer are indicated by virtual lines in the state shown in FIG. 5.

Each light-transmitting portion 52a of the light-shielding layer 52, i.e., each color filter, overlaps the corresponding opening 40a in the partition 40 demarcating the corresponding light-emitting element 30. Each color filter is smaller than the corresponding opening 40a. FIG. 6 shows a state in which the light-transmitting portions 52a are indicated by virtual lines in the state shown in FIG. 5.

The light-emitting sublayer and the hole injection sublayer in the light-emitting-functional layer 36 each have strong adhesion to the pixel electrodes 32 but weak adhesion to the partition 40. Thus, each of the light-emitting sublayers or each of the hole injection sublayers may have nonuniform thickness in the corresponding opening 40a in the partition. Furthermore, in some cases, each of the light-emitting sublayers or each of the hole injection sublayers does not adhere to the corresponding pixel electrode 32 in the vicinity of the partition 40. In these cases, luminance and chromaticity disadvantageously vary in a single pixel. Specifically, luminance and chromaticity at the peripheral portion close to the partition in each pixel may differ from those at the middle portion remote from the partition in the same pixel.

In this embodiment, each light-transmitting portion 52a of the light-shielding layer 52, i.e. each color filter, overlaps the corresponding opening 40a in the partition 40 and is smaller than the corresponding opening 40a. Thus, pencils of light viewable from the outside are regulated by the light-transmitting portions 52a of the light-shielding layer 52. The light-shielding layer 52 masks peripheries of pixels. Even when luminance and chromaticity at the peripheries of the pixels close to the partition 40 differ from those at middle portions of the pixels remote from the partition 40, nonuniformity in luminance and chromaticity in a single pixel is not visually identified because the peripheries of the pixels are masked with the light-shielding layer 52.

Furthermore, the light-transmitting portions 52a of the light-shielding layer 52 overlap the respective openings 40a in the partition 40 partitioning the light-emitting elements and are each smaller than the corresponding the opening 40a. Thus, it is possible to enhance the directivity of the pencils of light radiating to the outside. When the emissive device 10 is used as an image display, the emissive device 10 facilitates visualization. When the emissive device 10 is used as an exposure device that is required to have high accuracy, it is possible to prevent the adverse effect on accuracy due to undesirable pencils of light.

It is difficult to make the openings 40a of the partition 40 with high precision. For example, many components, such as pixel circuits and electrodes, are stacked on the substrate 12, thus causing the deformation of the substrate 12 during the production. Even in the case of the partition 40 patterned according to a design, when the deformation of the substrate 12 is recovered after the production, positions or areas of the openings 40a in the partition 40 differ from target positions or target areas, in some cases. That is, positions or areas of the pixels differ from those in design, in some cases. In contrast, the light-shielding layer 52 and the color filters 54R, 54G, and 54B can be directly formed o the opposite substrate 50. Thus, the light-transmitting portions 52a of the light-shielding layer 52, i.e., the color filters, can be formed with high precision compared with the openings 40a in the partition 40. Furthermore, each light-transmitting portion 52a of the light-shielding layer 52 overlaps the corresponding opening 40a in the partition 40 demarcating the corresponding light-emitting element 30 and is smaller than the corresponding opening 40a. Thus, even when positions or areas of the light-emitting elements 30 are somewhat different from target positions or target areas, pencils of light having a target area is easily achieved since pencils of light viewable from the outside are regulated by the light-transmitting portions 52a of the light-shielding layer 52 formed with high precision.

When the light-emitting-functional layer 36 covers the partition 40 and extends across the light-emitting elements 30 as the embodiment shown in the figure, it is highly possible that the light-emitting sublayer in the light-emitting-functional layer 36 is exposed to extraneous light because of a large area of the light-emitting-functional layer 36. It is known that the exposure of the light-emitting sublayer to extraneous light results in light emission from the light-emitting sublayer due to photoexcitation. For example, it is known that the irradiation of the light-emitting sublayer with light results in the red-light emission of the light-emitting sublayer even under the conditions in which a current does not flow in any light-emitting elements. In this embodiment, however, portions which do not contribute to a desired emission in the light-emitting-functional layer 36, i.e., portions overlapping the partition 40, overlap not the light-transmitting portions 52a (color filters) but the light-shielding layer 52. Thus, it is possible to reduce emission from the light-emitting sublayer due to extraneous light.

Each of the light-transmitting portions 52a of the light-shielding layer 52, i.e., each of the color filters 54R, 54G, and 54B, overlaps the pixel electrode 32 of the corresponding light-emitting element 30 and is smaller than the corresponding pixel electrode 32. In particular, each of the color filters 54R, 54G, and 54B is smaller than the corresponding pixel electrode layer Pa, which is disposed in each of the pixel electrodes 32. Furthermore, each of the color filters 54R, 54G, and 54B is smaller than the region of the corresponding reflective layer 28. With respect to the light-emitting elements 30B and the color filters 54B, each light-emitting element 30B emits light. All of the pencils of light reflected from the corresponding reflective layer 28 resonate with a optical resonator including the corresponding dielectric layer 29, the corresponding reflective layer 28, and the corresponding pixel electrode 32 constituted by the pixel electrode layer Pa alone. Then, the pencils of light propagate toward the upper side of the figure and partially pass through the corresponding color filter 54B. That is, a significant portion of the pencils of light radiating to the outside through the corresponding color filter 54B resonates with the optical resonator before the pencils of light reach the corresponding color filter 54B, thereby increasing the intensity of a blue-light component compared with the intensity of other light components. The pencils of light with the strong blue-light component radiate to the outside through the corresponding color filter 54B, thereby improving the chromaticity of the pencils of light.

In each of the light-emitting elements 30G and 30R, each of the pixel electrode layers Pb overlaps the corresponding pixel electrode layer Pa and has an area larger than the corresponding pixel electrode layer Pa. Each of the color filters 54R and 54G overlaps the corresponding pixel electrode layer Pb and is smaller than the corresponding pixel electrode layer Pb. With respect to each of the light-emitting elements 30G and the corresponding color filter 54G, each light-emitting element 30G emits light. All of e pencils of light reflected from the corresponding reflective layer 28 resonate with an optical resonator including the corresponding dielectric layer 29, the corresponding reflective layer 28, and the corresponding pixel electrode 32 constituted by the pixel electrode layers Pa and Pb. Then, the pencils of light propagate toward the upper side of the figure and partially pass through the corresponding color filter 54G. That is, a significant portion of the pencils of light radiating to the outside through the corresponding color filter 54G resonates with the optical resonator before the pencils of light reach the corresponding color filter 54G, thereby increasing the intensity of a green-light component compared with the intensity of other light components. The pencils of light with the strong green-light component radiate to the outside through the corresponding color filter 54G, thereby improving the chromaticity of the pencils of light.

In each of the light-emitting elements 30R, each of the pixel electrode layers Pc overlaps the corresponding pixel electrode layer Pb and has an area larger than the corresponding pixel electrode layer Pb. Each of the color filters 54R overlaps the corresponding pixel electrode layer Pc and is smaller than the corresponding pixel electrode layer Pc. With respect to each of the light-emitting elements 30R and the corresponding color filter 54R, each light-emitting element 30R emits light. All of the pencils of light reflected from the corresponding reflective layer 28 resonate with an optical resonator including the corresponding dielectric layer 29, the corresponding reflective layer 28, and the corresponding pixel electrode 32 constituted by the pixel electrode layers Pa, Pb, and Pc. Then, the pencils of light propagate toward the upper side of the figure and partially pass through the corresponding color filter 54R. That is, a significant portion of the pencils of light radiating to the outside through the corresponding color filter 54R resonates with the optical resonator before the pencils of light reach the corresponding color filter 54R, thereby increasing the intensity of a red-light component compared with the intensity of other light components. The pencils of light with the strong red-light component radiate to the outside through the corresponding color filter 54R, thereby improving the chromaticity of the pencils of light.

Each of the reflective layers 28 reflects light emitted from the corresponding light-emitting element 30. Each reflective layer 28 overlaps the corresponding opening 40a of the partition 40 and is partially covered with the partition 40. The light-shielding layer 52 overlaps a portion of each reflective layer 28, the portion being covered with the partition 40. When the partition 40 is composed of a transparent material, light reflected from the portion of each reflective layer 28, the portion being covered with the partition 40, may come through the partition 40 and may propagate toward the corresponding light-transmitting portion 52a of the light-shielding layer 52. In particular, extraneous light enters the emissive device through the light-transmitting portions 52a of the light-shielding layer 52 in a well-lighted area. When light reflected from the reflective layers 28 radiates to the outside through the light-transmitting portions 52a, image contrast decreases. However, the light-shielding layer 52 overlaps the portions of the reflective layers 28, each of the portions being covered with the partition 40; hence, it is possible to inhibit the radiation of the reflected light through the light-transmitting portions 52a.

The reflective layers 28 cover the channel regions 20b of the respective pixel transistors 20. Thus, extraneous light is prevented from arriving at the channel regions 20b of the pixel transistors 20. Therefore, the pixel transistors 20 are prevented from malfunctioning caused by the generation of a photocurrent in the pixel transistors 20.

The auxiliary leads 42 are covered with the light-shielding layer 52. In some cases, the auxiliary leads 42 are each composed of a material, such as aluminums having high reflectivity. However, covering the auxiliary leads 42 with the light-shielding layer 52 prevents the reflection of extraneous light from the auxiliary leads 42, thus preventing a reduction in image contrast in a well-lighted area.

As shown in FIG. 5, the color filters 54R, 54G, and 54B disposed at the light-transmitting portions 52a of the light-shielding layer 52 have different areas in response to target colors. As described above, the intensity of a light component of a predetermined wavelength is increased compared with light components of other wavelengths before pencils of light reach each color filter. However, a red-light component to enter the color filter 54R, a green-light component to enter the color filter 54G, and a blue-light component to enter the color filter 54B do not have the same radiance (unit: $W/sr/m^2$) Furthermore, degrees of conversion efficiency of the color filters are different in response to the target colors. The term "conversion efficiency" means the ratio of the luminance of light incident on the color filter to the luminance of outgoing light from the color filter. Thus, even when a constant driving current is applied to the light-emitting elements 30 which have the same size and the same structure, the degrees of luminance of light converted through the color filters are different in response to the types of color filters, i.e., target colors. Degrees of luminous efficiency (the degree of sensitivity of an eye) are different in response to red, green, and blue. In general, it is said that luminous efficiency of green is high. For example, when red-, green-, and blue-pixels emit light components having the same intensity in order to express white, the resulting light may have a slightly greenish color due to the difference in luminous efficiency. Therefore, even when a constant driving current is applied to light-emitting elements 30 which have the same size and the same structure, degrees of luminance (unit: $cd/^2$), which is the product of radiance and luminous efficiency, of light converted through the color filters are different in response to the types of color filters, i.e., target colors, because of the composite factors.

In this embodiment shown in FIG. 1, the color filter 54R has the maximum area, and the color filter 54G has the minimum area. This results from the consideration of spectrum properties of light incident on the color filters, the conversion efficiency of the color filters, and/or luminous efficiency. In this way, the areas of the color filters are changed in consideration of the spectrum properties of light incident on the color filters, the conversion efficiency of the color filters, and/or luminous efficiency; hence, luminous intensity (unit: candela), which is the product of luminance and the area, can be appropriately set in response to the light-emitting elements 30. Consequently, it is possible to improve image quality by striking a balance between the target colors.

To strike a balance between the target colors, it is contemplated that a current flowing through the light-emitting element 30 in which the luminance of light passing through the color filter is low is increased to enhance the luminance and luminous intensity of the light-emitting element 30. However, an increase in electric current density in the light-emitting element 30 exponentially reduces the lifetime of the light-emitting element 30. Thus, lifetimes of the light-emitting elements 30 undesirably varies due to the color filters. At the end of a light-emitting element 30 corresponding to a specific target color, even when other light-emitting elements 30 corresponding to other target colors can be still used, the device cannot be used as a whole.

In this embodiment, a change in the areas of the color filters in response to the target colors can compensate for a variation in the luminous intensity of light passing through the color filters. Current densities in the light-emitting elements 30 do not need to be changed in response to the target colors, thus preventing the occurrence of the variation in the lifetime of the light-emitting elements 30. Thus, the light-emitting element 30 having significantly short lifetime is eliminated, thereby prolonging the lifetime of the device as a whole.

In a preferred embodiment, the openings 40a of the partition 40 have a constant area, regardless of the light-emitting elements 30R, 30G, and 30B. Furthermore, light-emitting elements 30R, 30G, and 30B have a constant area. By allowing a constant current to flow through the light-emitting elements 30R, 30G, and 30B, these light-emitting elements have the same current density.

In addition, when the pixel transistors 20 for driving the light-emitting elements 30R, 30G, and 30B has the same size, the pixel transistors 20 can have reliability at the same level. Furthermore, substantially the same potential of data signals can be applied to the pixel transistors 20, thus improving the reliability of a data-line-driving circuit (not shown) and reducing the number of power sources for the data-line-driving circuit.

Applications

Figure 7:
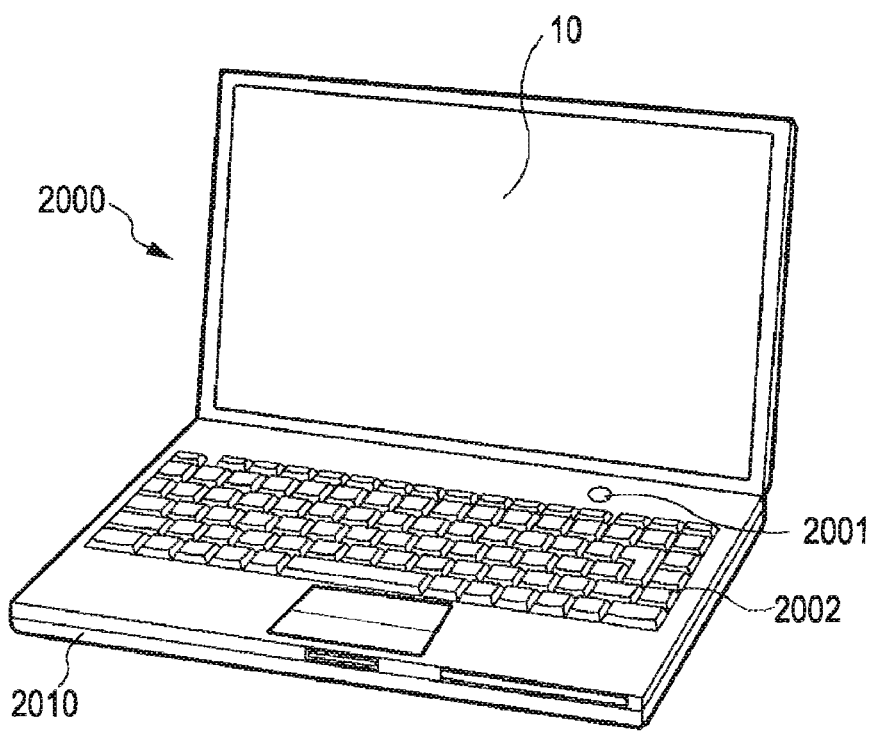
FIG. 7 is a perspective view of the appearance of a personal computer including an emissive device according to an embodiment of the invention.

An electronic apparatus including an emissive device according to an embodiment of the invention will be described below. FIG. 7 is a perspective view of a mobile personal computer including the emissive device 10 according to the above-described embodiment. A personal computer 2000 includes the emissive device 10 as a display and a main body 2010. The main body 2010 includes a power button 2001 and a keyboard 2002. The emissive device 10 includes the light-emitting elements 30, which are OLED elements; hence, the emissive device 10 can provide an easily viewable screen having a wide viewing angle.

Figure 8:
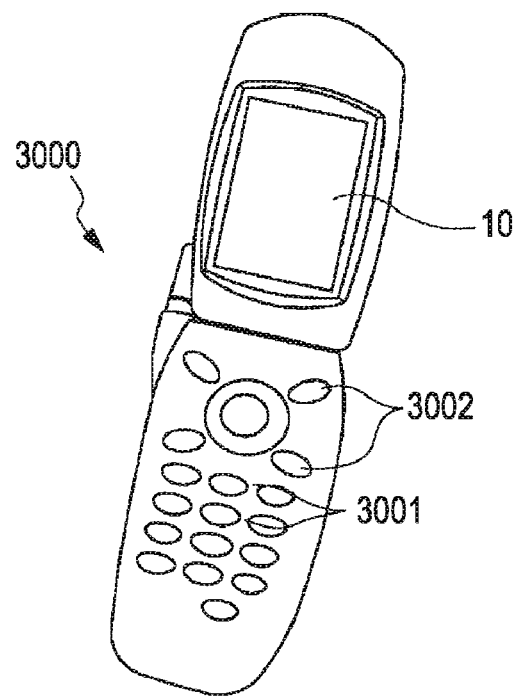
FIG. 8 is a perspective view of the appearance of a cellular phone including an emissive device according to an embodiment of the invention.

FIG. 8 is a perspective view of a cellular phone including the emissive device 10 according to the above-described embodiment. A cellular phone 3000 includes operation buttons 3001, scroll buttons 3002, and the emissive device 10 as a display. Operation of each scroll button 3002 scrolls an image displayed on the emissive device 10.

Figure 9:
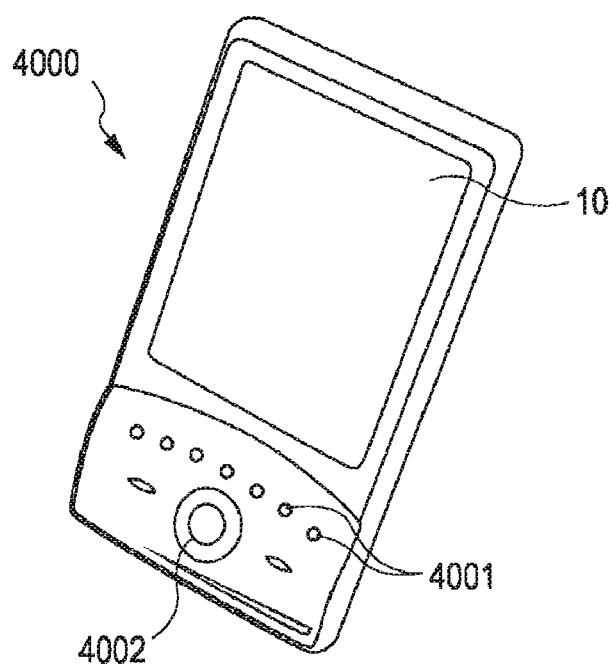
FIG. 9 is a perspective view of the appearance of a personal digital assistant including an emissive device according to an embodiment of the invention.

FIG. 9 is a perspective view of a personal digital assistant (PDA) including the emissive device 10 according to the above-described embodiment. A personal digital assistant 4000 includes operation buttons 4001, a power button 4002, and the emissive device 10 as a display. Operation of the power button 4002 displays various types of information, for example, address files and a schedule book.

Modifications

While the exemplified emissive device includes OLED elements as the light-emitting elements 30, the range of the invention is not limited to the OLED elements. Inorganic light-emitting diodes or other appropriate light-emitting elements may be used. Furthermore, the details of the structures of the exemplified electro-optic devices have been specifically described in order to facilitate understanding of the invention. The invention is not limited to these structures. Any other structure may be used.

In the above-described embodiment, the common electrode 38 functions as a cathode for the light-emitting elements 30, The pixel electrodes 32 function as anodes. Alternatively, the common electrode 38 may function as an anode, and the pixel electrodes 32 may function as cathodes. Furthermore, in the above-described embodiment, the common electrode 38 is used as a single cathode for all of the light-emitting elements 30. Alternatively, a plurality of common electrodes may be disposed. The common electrodes may be used as cathodes for different light-emitting elements 30.

The conversion layers disposed in the light-transmitting portions 52a of the light-shielding layer 52 are not limited to color filters but may be photoluminescent components that receive light to emit another colored light. The color of light emitted from the OLED elements is preferably white but may be another color. Furthermore, types of color conversion layers, i.e., target colors, are not limited to R, G, and B but may be other colors. The number of types of the color conversion layers, i.e., the number of target colors, is not limited to three but may be two or more.

Examples of the electronic apparatus that can include the emissive device according to an embodiment of the invention include digital still cameras, television sets, video cameras, car navigation systems, pagers, electronic notebooks, electronic paper, electronic calculators, word processors, work stations, videophones, point-of-sale (POS) terminals, light sources, such as printer heads (latent-image write device) included in image printers using an electrophotographic method, the printer heads forming latent images by irradiating image carriers with light, printers, scanners, copiers, video players, and apparatuses including touch panels, in addition to the apparatuses shown in FIGS. 7 to 9.

In an electronic apparatus, such as a printer head, the emissive device do not need to emit multicolored light to the outside. In such a case, the color conversion layers, such as the color filters, do not need to be disposed at the light-transmitting portions 52a of the light-shielding layer 52. Furthermore, the pixel electrodes 32 do not need to have different thicknesses in response to the target colors for the purpose of optical resonance. The pixel electrodes 32 may be used as reflective layers. That is, the reflective layers 28 separated from the pixel electrodes 32 do not need to be disposed.

What is claimed is:

1. An emissive device comprising:
a substrate;
a plurality of light-emitting elements disposed on the substrate;
an opposite substrate opposed to the substrate;
a light-shielding layer disposed on the opposite substrate, the light-shielding layer having light-transmitting portions that transmit light emitted from the light-emitting elements;
a partition composed of an insulating material and disposed on the substrate, the partition partitioning the light-emitting elements and having openings each demarcating the light-emitting region of the corresponding light-emitting element; and
a reflective layer positioned below the partition and overlapping at least one of the openings such that the reflective layer is partially covered with a portion of the partition, the covered portion overlapping the light-shielding layer,
wherein each of the light-transmitting portions overlaps the corresponding opening and is smaller than the corresponding opening, at least a first light transmitting portion having a first width corresponding to a light-emitting element that emits a first color, and at least a second light transmitting portion having a second width corresponding to a light-emitting element that emits a second color, the second width being different than the first width.

2. The emissive device according to claim 1, further comprising:
the reflective layer reflects light emitted from the light-emitting elements, the reflective layer being disposed between the corresponding light-emitting element and the substrate, and
the light-shielding layer overlaps portions of the reflective layers that are covered by the partition.

3. The emissive device according to claim 2, further comprising:
first electrodes;
a second electrode; and
a light-emitting sublayer disposed between the second electrode and the individual first electrodes,
wherein each of the first electrodes is closer to the corresponding reflective layer than the second electrode, is composed of indium tin oxide, indium zinc oxide, or ZnO$_2$, overlaps the corresponding reflective layer, and is wider than the corresponding reflective layer.

4. The emissive device according to claim 1, further comprising:
color conversion layers for converting the color of light emitted from the light-emitting elements into different target colors, each of the color conversion layers being disposed at the corresponding light-transmitting portion,
wherein the color conversion layers providing different target colors have different areas.

5. An electronic apparatus including the emissive device according to claim 1.

6. The emissive device according to claim 1, wherein the first light-emitting element that emits the first color of light has a first pixel electrode having a first pixel electrode layer; and
the second light-emitting element that emits the second color has a second pixel electrode that includes the first pixel electrode layer and a second pixel electrode layer.

7. The emissive device according to claim 6, further comprising:
a third light-emitting element that emits a third color of light has a third pixel electrode that includes the first pixel electrode layer, the second electrode layer and a third pixel electrode layer.

8. An emissive device comprising:
a substrate;
a first light-emitting element;
a second light-emitting element;
a light-shielding layer opposite the substrate, the first light-emitting element and the second light-emitting element being disposed between the substrate and the light-shielding layer, and the light-shielding layer having a first color conversion layer for converting a first color of light emitted from the first light-emitting element into a first target color and a second color conversion layer for converting a second color of light emitted from the second light-emitting element into a second target color;
a partition composed of an insulating material and disposed on the substrate, the partition partitioning the first light-emitting element and the second light-emitting element and having a first opening demarcating a first light-emitting region of the first light-emitting element and a second opening demarcating a first light-emitting region of the second light-emitting element,
an area of the first color conversion layer being smaller than that of the first opening, an area of the second color conversion layer being smaller than that of the second opening, and the area of the first color conversion layer being different from that of the second color conversion layer.

9. The emissive device according to claim 8, the first light emitting element emitting the same color as the second light emitting element.

10. The emissive device according to claim 8, the first opening being the same area as the second opening.

11. The emissive device according to claim 8, further comprising:
a first transistor for driving the first light-emitting element; and
a second transistor for driving the second light-emitting element, a size of the first transistor being same as that of the second transistor.

12. The emissive device according to claim 8, wherein the first light-emitting element that emits the first color of light has a first pixel electrode having a first pixel electrode layer; and
the second light-emitting element that emits the second color has a second pixel electrode that includes the first pixel electrode layer and a second pixel electrode layer.

13. The emissive device according to claim 12, further comprising:
a third light-emitting element that emits a third color of light has a third pixel electrode that includes the first pixel electrode layer, the second electrode layer and a third pixel electrode layer.

\* \* \* \* \*